United States Patent [19]
Ressl

[11] Patent Number: 6,075,909
[45] Date of Patent: Jun. 13, 2000

[54] OPTICAL MONITORING SYSTEM FOR III-V WAFER PROCESSING

[75] Inventor: Michael G. Ressl, Western Springs, Ill.

[73] Assignee: Lucent Technologies, Inc., Murray Hill, N.J.

[21] Appl. No.: 09/105,712

[22] Filed: Jun. 26, 1998

[51] Int. Cl.[7] .................................................. G02B 6/12
[52] U.S. Cl. ................................................................ 385/14
[58] Field of Search ........................ 385/72, 80, 88–90, 385/147; 356/236.7

[56] References Cited

U.S. PATENT DOCUMENTS

| | | | |
|---|---|---|---|
| 4,659,220 | 4/1987 | Bronte et al. ...................... | 356/237.5 |
| 5,414,504 | 5/1995 | Litvak et al. ...................... | 356/72 |
| 5,465,154 | 11/1995 | Litvak et al. ...................... | 356/72 |
| 5,786,886 | 7/1998 | Litvak et al. ...................... | 356/72 |
| 5,946,082 | 10/1999 | Litvak et al. ...................... | 356/72 |
| 5,969,639 | 10/1999 | Lauf et al. ...................... | 340/870.17 |

*Primary Examiner*—Akm E. Ullah
*Attorney, Agent, or Firm*—Wendy W. Koba

[57] ABSTRACT

An optical monitoring system for III–V integrated circuit wafers utilizes an optical transmitter/receiver assembly formed in the wafer at an early stage in the fabrication process. The optical transmitter is then activated and the optical output signal is monitored during subsequent processing steps, such as ion implantation and layer deposition to assess the quality of the process. In one embodiment, the monitoring system is useful as an endpoint detection process.

11 Claims, 3 Drawing Sheets

OPTICAL MONITORING SYSTEM FOR III-V WAFER PROCESSING

BACKGROUND OF THE INVENTION

The present invention relates to an optical monitoring system for semiconductor wafer processing and, more particularly, to the inclusion of an optical test device on the wafer surface that is capable of assessing the quality of various wafer processing steps.

There are a variety of high speed integrated circuit devices that are fabricated using wafers of, for example, Group III–V semiconductor material. Most commonly, these integrated circuits are formed on GaAs wafers. The processing steps in forming these devices include various fabrication techniques, including depositing layers of various other materials on the wafer surface and implanting dopants into the wafer. It is important that these doping and deposition processing steps be well-controlled in order to form devices with the desired characteristics in terms of speed, performance, etc.

One prior art technique for monitoring the process quality of these implant and layering processes consists of fabricating an electrical ring resonator test structure on the wafer along with the other integrated circuits. A problem with using an electrical ring resonator, however, is its speed limitations (MHz) as compared to the performance speed of the integrated circuits being fabricated (GHz-THz). Therefore, any test data that may be collected may not include sufficient resolution. Additionally, the electrical ring resonator is only activated subsequent to the device fabrication process (and, therefore, used to check the final performance characteristics of the devices under test), and cannot serve as a "real time" monitor for the various process steps.

Thus, a need remains in the art for an arrangement capable of providing real-time monitoring of the III–V device fabrication process at the speed needed (GHz-THz) for these devices.

SUMMARY OF THE INVENTION

The need remaining in the art is addressed by the present invention, which relates to an optical monitoring system for semiconductor wafer processing and, more particularly, to the inclusion of an optical test system on the wafer surface that is capable of assessing the quality of various wafer processing steps.

In accordance with the present invention, an optical test system comprises an optical transmitter (e.g., laser) and receiver (e.g., photodiode) built into the wafer surface at a relatively early stage in the fabrication process. Subsequent processing steps, such as dopant implantation or deposition of additional layers of material, will alter the waveguide region of the optical test system and will therefore be detected as changes in the optical output by the receiver. This optical signal can then be used as part of a control feedback system and may, for example, be used to determine the proper endpoint for one or more of the fabrication steps.

In one embodiment of the present invention, an electrical input is used to activate the laser and an electrical output is taken from the photoreceiver and used as an input to an off-wafer monitoring system. The waveguide between the laser and photodiode may comprise any suitable geometry and, in one embodiment, may comprise a circular waveguide that surrounds the periphery of the entire wafer so as to regulate any process irregularities across the surface of the wafer. Any other suitable geometry is possible. Additionally, more than one optical monitor may be formed on the wafer surface, where the outputs from the various monitors are collectively studied to provide an "averaged" control signal, or to regulate (and therefore correct) any process irregularities across the surface of the wafer.

In an alternative embodiment, a pump source may be included to provide an optical input signal, instead of the electrical input mentioned above. Further, the output may be monitored in the optical domain; in particular, by monitoring the change in polarization of an optical signal as it propagates through the thickness of the wafer.

Other and further embodiments of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
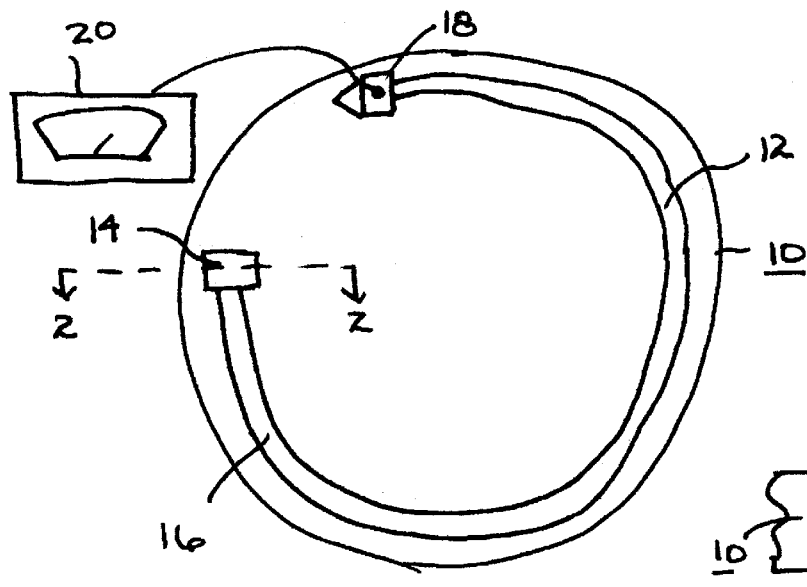
FIG. 1 is a top view of an exemplary semiconductor wafer including an optical monitoring system of the present invention, the FIG. 1 embodiment including a circular laser cavity formed around the periphery of the wafer.

An exemplary III–V wafer 10 including an optical system 12 of the present invention is illustrated in FIG. 1. For the purposes of the present discussion, wafer 10 may be referred to as a GaAs wafer. However, it is to be understood that the optical monitoring system of the present invention may be used with various other types of III–V device fabrication systems, including but not limited to, InP, InGaAsP, AlGaAs, etc. In each instance the particular parameters of the incorporated optical monitor may vary, but each of these systems is capable of supporting conventional optical devices, such as lasers, waveguides and photodetectors, that are used to provide the monitoring of the present invention. Referring in particular to FIG. 1, optical monitoring system 12 includes an optical transmitter 14 (such as a laser or LED) coupled to a gain section 16 formed as a circular waveguide in the top surface 17 of the GaAs substrate. A photoreceiver 18 (e.g., a photodiode) is formed on surface 17 so as to couple to the opposing end of gain section 16. The electrical output from photoreceiver 18 (the electrical output being a direct transform of the received optical signal) is thereafter applied as an input to a monitoring device 20. The integrated circuits being fabricated on wafer 10 will be included within, for example, the region defined by boundary 22. Therefore, a significant plurality of devices may be formed on the wafer surface and remain sufficiently separated from the components of the optical monitoring system.

In operation of the optical monitoring system of the present invention, device 20 utilizes the parameters of the electrical output signal from photoreceiver 18 as a control signal for the particular fabrication step current in process. For example, if wafer 10 is being implanted with a dopant to modify the electrical characteristics of the wafer, gain section 12 of optical monitoring system will also be modified, thereby altering the received optical (and hence, electrical) signal. An initial analysis of the desired degree of change associated with proper implantation will allow monitoring device 20 to assess the implantation process as related to the "control". Additionally, a predetermined change in the optical/electrical output may be used to indicate when the proper doping concentration has been achieved; that is, the optical monitoring system of the present invention may be used as a process "endpoint detection" process.

Figure 2:
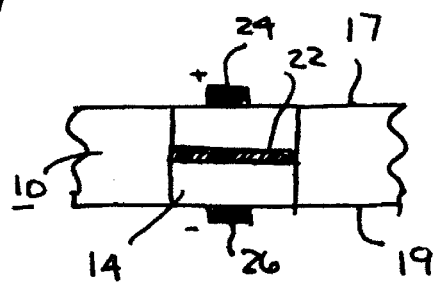
FIG. 2 is sectional view of the wafer of FIG. 1, taken along line 2—2.

FIG. 2 is a partial cross-section view of wafer 10 including optical transmitter 14. In this particular embodiment, transmitter 14 is formed as a GaAs laser with an active region 22 comprising, for example, InGaAsP. Action region 22 is disposed within laser 14 so as to couple to gain region 16 (as shown in FIG. 1) and provide a sufficient optical monitoring signal. Laser 14 is biased by including a top side electrode 24 on top surface 17 of wafer 10 and a bottom side electrode 26 disposed at a proper position on bottom surface 19 of wafer 10. Photoreceiver 18 includes similar electrical contacts, where the top side contact is coupled to monitoring device 20.

Figure 3:
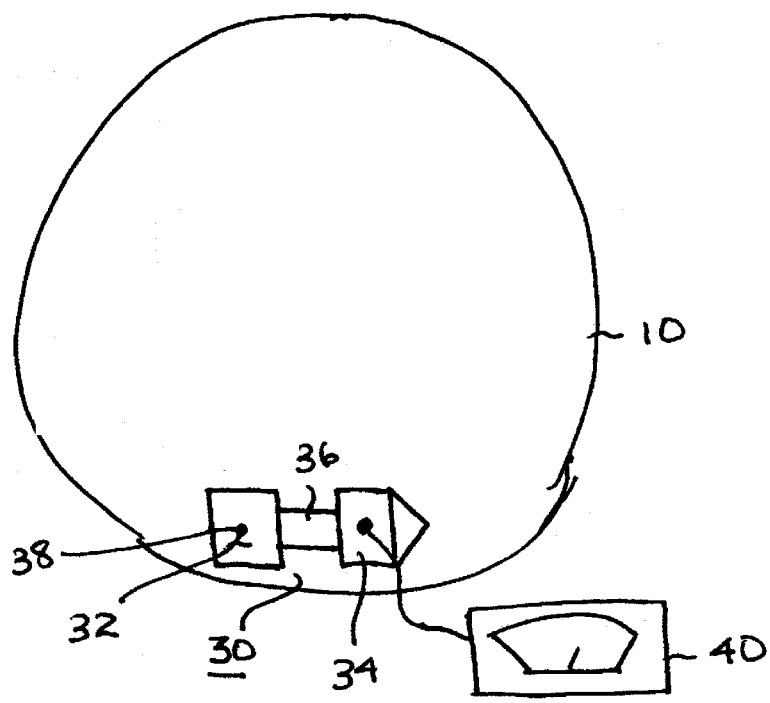
FIG. 3 is a top view of a semiconductor wafer including an alternative optical monitoring system, including a linear laser cavity.

As mentioned above, various other optical monitoring system geometries are possible. The arrangement of FIG. 1 is considered to be particularly well-suited for situations where it is desired to "average out" process-related homogeneities, since the gain medium traverses a significant portion of the periphery of the wafer surface. Other possible systems are illustrated in the remaining figures. In particular, FIG. 3 illustrates an optical monitoring system 30 that occupies very little surface area on wafer 10, where this attribute may be beneficial for certain integrated circuit arrangements that are particularly dense and cannot lend the entire wafer periphery to a monitoring system (such as that of FIG. 1). Referring to FIG. 3, optical monitoring system 30 comprises an optical transmitter 32, similar to transmitter 14 of FIG. 1 and an optical receiver 34 (again, similar to receiver 18 of FIG. 1). A relatively short linear optical cavity 36 is disposed to provide optical coupling between transmitter 32 and receiver 34. Transmitter 32 is electrically biased to generate an optical output signal which thereafter propagates through cavity 36 and is coupled into receiver 34. The electrical output from receiver 34 is used by an associated monitoring device 38 to evaluate the fabrication processes. That is, as with the arrangement described above, subsequent wafer processing in terms of dopant implantation and/or layer deposition, will also change the characteristics of cavity 36. The physical changes in cavity 36 thereby result in changes in the optical signal passing therethrough and, ultimately, in the electrical signal received by monitoring device 40. In particular, the physical changes will take the form of changes in dopant concentration within cavity 36 or, alternatively, changes in the material comprising cavity 36 (as a result of adding layers of other material to wafer 10). The optical monitoring system of the present invention, therefore, is particularly useful in "endpoint detection" in terms of determining when, for example, a sufficient dopant concentration has been obtained, or a predetermined layer thickness has been achieved, by monitoring the changes in the received electrical signal.

Figure 4:
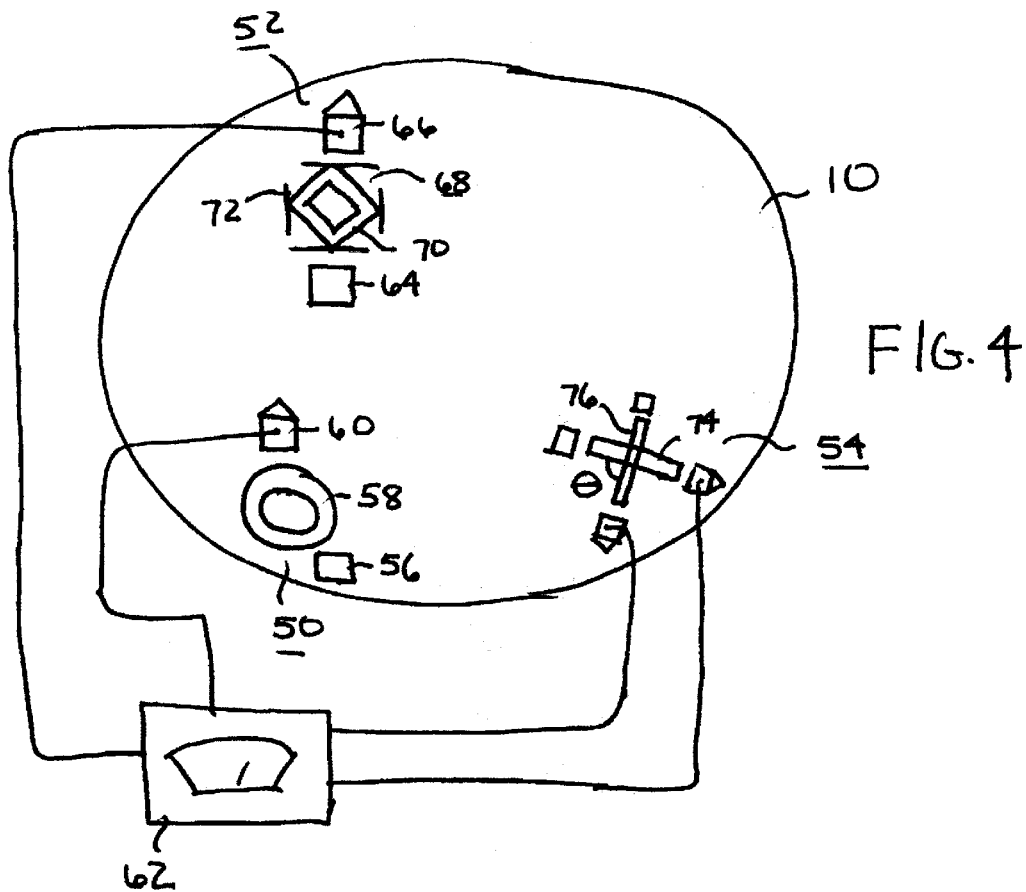
FIG. 4 is a top view of a semiconductor wafer illustrating two other embodiments of the present invention, a multi-reflective optical system and a ring system, where one or more such systems may used simultaneously.

FIG. 4 contains a top view of a GaAs wafer 10 including a first optical monitoring system 50, a second optical monitoring system 52, and a third optical monitoring system 54. Any of these systems may be used individually or, as mentioned above, may be used in any combination to provide for an "averaged" response, or to determine spatial variations across the surface of the wafer. System 50 includes a light source 56 (laser or LED, for example) optically coupled to a ring resonator 58. The optical output from resonator 58 is coupled to a photodiode 60 which translates this received optical signal into an electrical signal that is transmitted to a monitoring device 62. System 52 includes a light source 64 and photodiode 66 optically coupled through a multi-reflection waveguide 68. As shown, waveguide 68 comprises a set of four linear waveguide sections 70 with reflective surfaces 72 disposed at the intersection of each pair of waveguide sections to allow for the optical signal to propagate in a resonant mode. The third system 54 consists of a pair of cross-coupled linear systems 74 and 76, where the angle θ between waveguides 78 and 79 is at the discretion of the user. The degree of evanescent field coupling between the pair of linear systems will be impacted by physical changes in the waveguide material and is therefore suitable for the monitoring purposes of the present invention. When using one or more of these systems in combination, they may be disposed at disparate locations on the wafer surface so that the monitored characteristics (i.e., dopant concentration, deposition) may be measured in different locations and the results averaged together (or, alternatively an error signal may be formed by looking at the difference between each reading).

Figure 5:
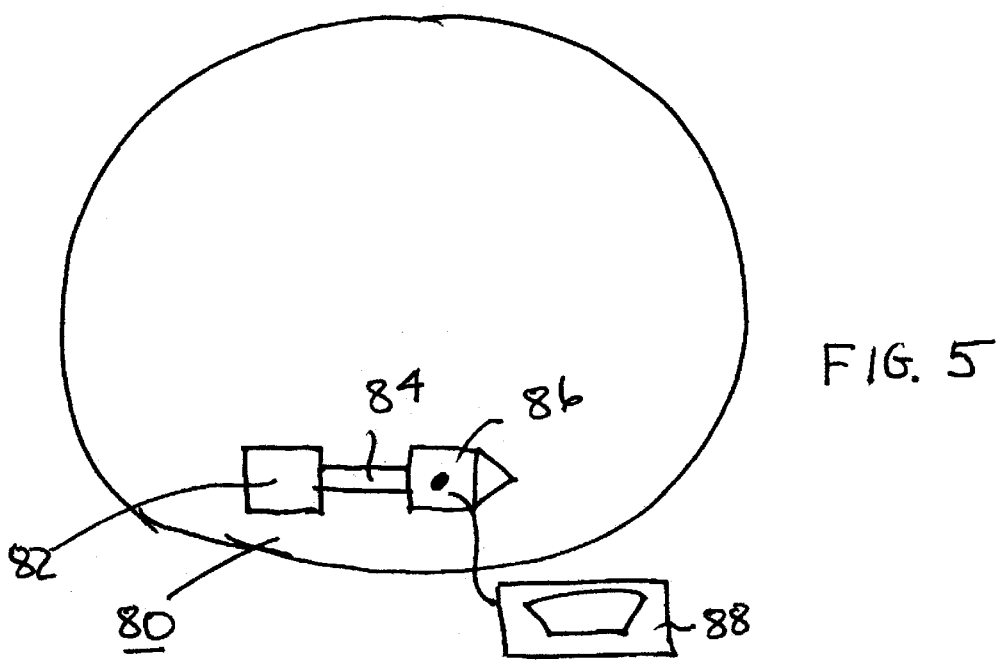
FIG. 5 is a top view of a semiconductor wafer illustrating an optically-driven monitoring system, incorporating a pump source to drive the laser.

As with the arrangements discussed in FIGS. 1 and 3, the various exemplary optical monitoring systems shown in FIG. 4 utilize electrical inputs to activate the light source and electrical outputs to form a control signal. In an alternative embodiment, an optical signal may be used to power the light source. FIG. 5 illustrates an exemplary optical monitoring system 80 that utilizes an optical pump 82 to excite laser 84. A photoreceiver 86 is coupled to laser 84 and provides an electrical output signal to a monitoring device 88. As with the embodiments discussed above, physical changes in the wafer surface associated with integrated circuit fabrication processes, such as ion implantation or layer deposition, will change the properties of the waveguide within optical system 80, thereby modifying the optical signal received by photoreceiver 86 and the electrical signal transmitted to monitoring device 88. Therefore, the electrical signal applied as an input to monitoring device 88 may be used to control various aspects of the fabrication process including, but not limited to, determining when to complete a particular step in the process.

Figure 6:
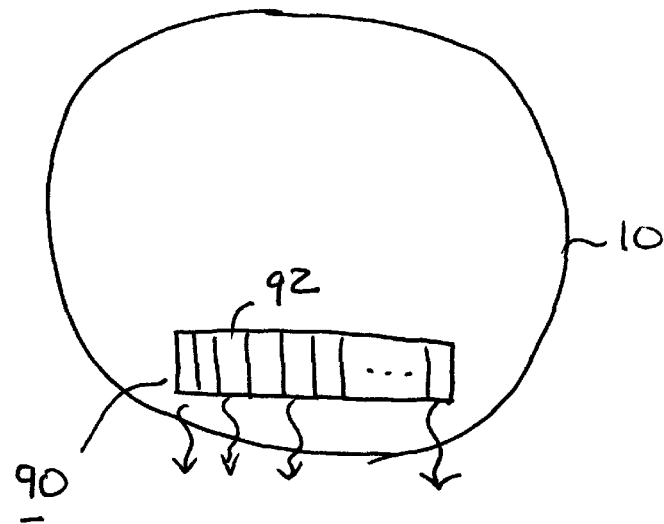
FIG. 6 contains a top wafer view of an alternative monitoring system of the present invention utilizing a MQW laser array and an external optical signal monitor.

In an alternative arrangement, a monitoring system of the present invention may utilize an electrical input and provide an optical output monitoring signal. FIG. 6 illustrates one such arrangement, utilizing an array 90 of multiple quantum well devices. In particular, each separate MQW device 92 will generate a separate optical output signal. Since the various stripes are evanescently coupled, however, the output will not be a set of separate "spots", but the phase relationship will result in large vertical stripe output signals.

As is well-known, the dopant level within the MQW structure, as well as the material forming each separate layer, will affect the output from each device. Therefore, by assessing the size, number and separation between adjacent stripes in the pattern, an indication may be derived, in accordance with the present invention, regarding the physical properties of the wafer.

Figure 7:
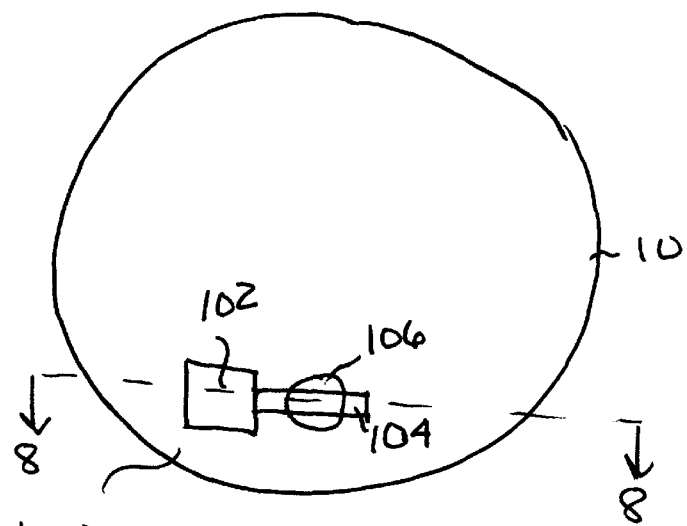
FIG. 7 contains a top view of a wafer including an all-optical monitoring system, using a pump source to drive the laser and a polarized optical probe to evaluate the optical output.
Figure 8:
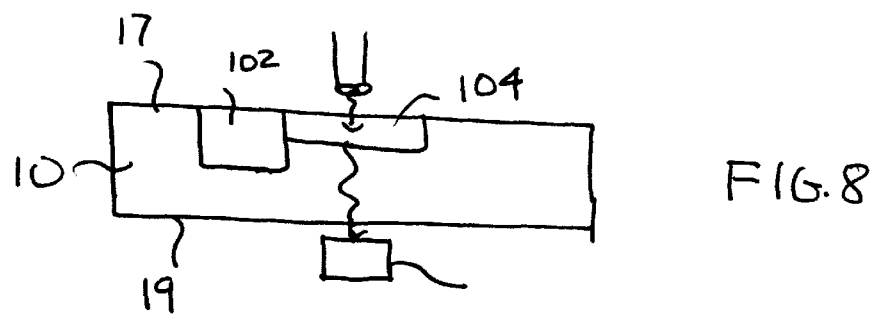
FIG. 8 is a sectional view of the arrangement of FIG. 7, taken along line 8—8.
Figure 1:
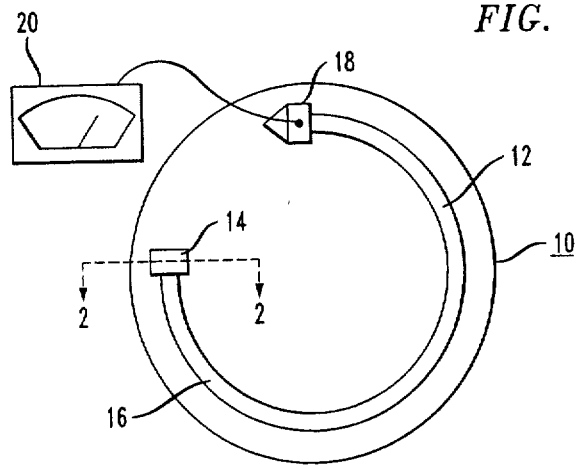
Figure 2:
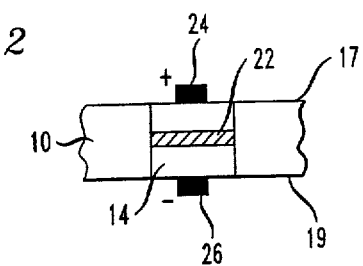
Figure 3:
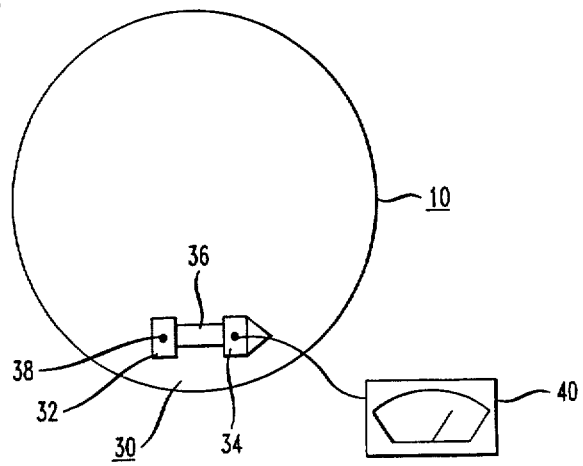
Figure 4:
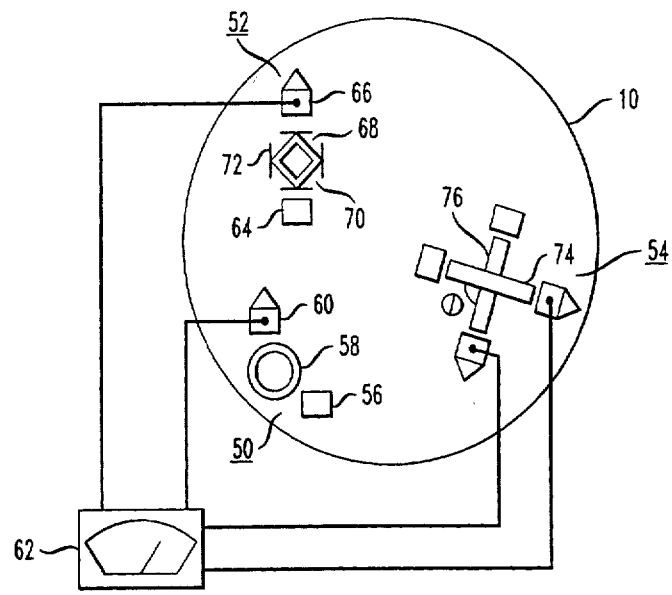
Figure 5:
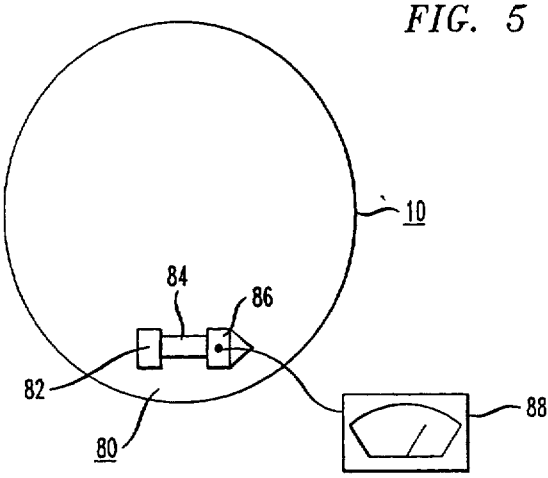
Figure 6:
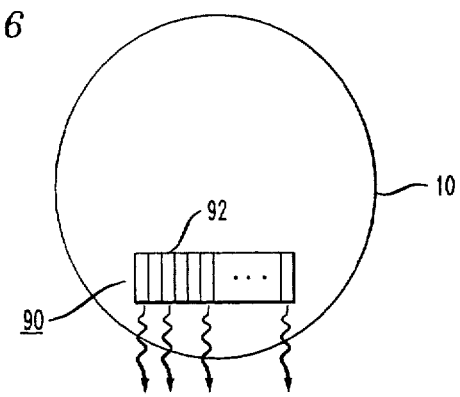
Figure 7:
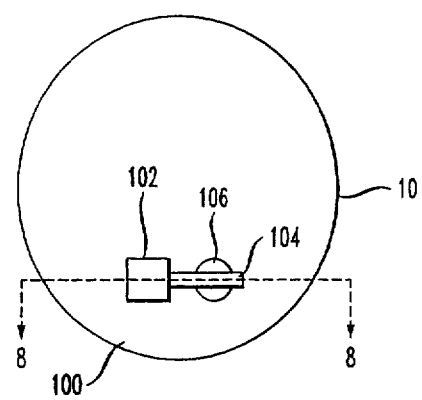
Figure 8:
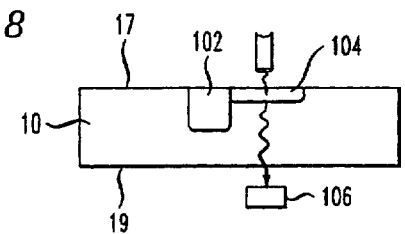

FIG. 7 illustrates an "all optical" embodiment 100 of the optical monitoring system of the present invention. In particular, system 100 includes a pump 102 to excite a laser transmitter 104. An optical probe 106 is used to transmit polarized light P through wafer 10 from upper surface 17 to bottom surface 19, as shown clearly in the sectional view of FIG. 8. The optical signal exiting through bottom surface 19 is then monitored for changes in its polarization state. Physical changes in the wafer will result in changing the polarization of the signal passing therethrough and thus allows this signal to be used as a control signal for the fabrication process.

What is claimed is:

1. An optical monitoring system for a semiconductor wafer, said system comprising an optical transmitter fabricated within a top surface of semiconductor wafer;

an optical waveguide formed in a surface region of said semiconductor wafer and coupled to said optical transmitter to support the propagation of an optical output signal from said transmitter;

an optical receiver fabricated within said top surface of said semiconductor wafer and coupled to said optical waveguide for receiving the optical output signal from said transmitter; and a monitoring device coupled to said optical receiver for measuring the output signal and evaluating predetermined process parameters of said semiconductor wafer as a function of the output signal.

2. An optical monitoring system as defined in claim 1 wherein the predetermined process parameters include dopant concentration of said semiconductor wafer and thickness of deposited layers on the top surface of the semiconductor wafer.

3. An optical monitoring system as defined in claim 1 wherein the optical transmitter is biased by an externally applied electrical signal to generate the optical output signal.

4. An optical monitoring system as defined in claim 1 wherein the optical receiver includes a photodiode for converting the received optical signal into an electrical equivalent.

5. An optical monitoring system as defined in claim 1 wherein the optical waveguide is disposed in a arcuate pattern around the edge periphery of the semiconductor wafer.

6. An optical monitoring system as defined in claim 1 wherein the optical waveguide comprises a linear waveguide disposed between the optical transmitter and the optical receiver.

7. An optical monitoring system as defined in claim 1 wherein the optical waveguide comprises a circular waveguide.

8. An optical monitoring system as defined in claim 1 wherein the optical waveguide comprises a plurality of linear sections including a reflector disposed at the intersection between adjacent sections.

9. An optical monitoring system as defined in claim 1 wherein the optical transmitter includes optical pump means for exciting the optical transmitter.

10. An optical monitoring system as defined in claim 1 wherein the optical receiver includes an optical probe for propagating a polarized signal through said semiconductor wafer and monitoring changes in optical polarization state as a function of the physical characteristics of said semiconductor wafer.

11. An optical monitoring system as defined in claim 1 wherein the optical transmitter comprises a plurality of MQW devices.

* * * * *

UNITED STATES PATENT AND TRADEMARK OFFICE
CERTIFICATE OF CORRECTION

PATENT NO.   : 6,075,909

Page 1 of 4

DATED         : June 13, 2000

INVENTOR(S) : Michael G. Ressl

It is certified that error appears in the above-identified patent and that said Letters Patent is hereby corrected as shown below:

Delete drawings and substitute therefore the attached Drawing Sheets.

Signed and Sealed this

Twenty-ninth Day of May, 2001

*Attest:*

NICHOLAS P. GODICI

*Attesting Officer*                *Acting Director of the United States Patent and Trademark Office*

1/3